United States Patent
Van Buren et al.

(10) Patent No.: US 9,065,415 B1
(45) Date of Patent: Jun. 23, 2015

(54) CONFIGURING SIGNAL BOOSTERS

(71) Applicant: Wilson Electronics, LLC, St. George, UT (US)

(72) Inventors: Vernon A. Van Buren, Cedar City, UT (US); Christopher K. Ashworth, St. George, UT (US); James Colin Clark, Washington, UT (US)

(73) Assignee: WILSON ELECTRONICS, LLC, St. George, UT (US)

( * ) Notice: Subject to any disclaimer, the term of this patent is extended or adjusted under 35 U.S.C. 154(b) by 0 days.

(21) Appl. No.: 14/166,246

(22) Filed: Jan. 28, 2014

(51) Int. Cl.
*H04B 7/14* (2006.01)
*H04B 1/38* (2006.01)
*H03G 3/30* (2006.01)
*H04B 7/155* (2006.01)

(52) U.S. Cl.
CPC ......... *H03G 3/3042* (2013.01); *H04B 7/15578* (2013.01)

(58) Field of Classification Search
USPC ............... 455/7, 11.1, 15, 571, 127.2, 232.1, 455/234.1, 234.2; 370/315
See application file for complete search history.

(56) References Cited

U.S. PATENT DOCUMENTS

| | | | |
|---|---|---|---|
| 6,690,915 B1 | 2/2004 | Ito et al. | |
| 7,245,893 B1 | 7/2007 | Husted et al. | |
| 7,865,159 B2 | 1/2011 | Dean | |
| 8,280,427 B2 | 10/2012 | Wang et al. | |
| 8,285,201 B2 | 10/2012 | Gore et al. | |
| 2003/0123401 A1 | 7/2003 | Dean | |
| 2004/0097189 A1 | 5/2004 | Bongfeldt et al. | |
| 2004/0219876 A1 | 11/2004 | Baker et al. | |
| 2004/0266339 A1 | 12/2004 | Larsson | |
| 2006/0025072 A1 | 2/2006 | Pan | |
| 2009/0196215 A1 | 8/2009 | Sabat et al. | |
| 2009/0325481 A1 | 12/2009 | Mohebbi | |
| 2011/0201269 A1 | 8/2011 | Hobbs et al. | |
| 2013/0077556 A1 | 3/2013 | Gore et al. | |
| 2013/0084906 A1 | 4/2013 | Van Buren et al. | |
| 2013/0203404 A1 | 8/2013 | Cook et al. | |

FOREIGN PATENT DOCUMENTS

WO  2013044074 A1  9/2012

OTHER PUBLICATIONS

A new approach to dynamically trade off performance and energy consumption in wireless communication systems Bougard, B.; Lenoir, G.; Eberle, W.; Catthoor, F.; Dehaene, W., Signal Processing Systems, 2003. SIPS 2003. IEEE Workshop on , vol., no., pp. 298,303, Aug. 27-29, 2003 doi: 10.1109/SIPS.2003.1235686.

Limits on fixed broadband devices for interference-free operation in the dtv spectrum O. Bendov Broadcasting, IEEE Transactions on , vol. 53, No. 4, pp. 746,754, Dec. 2007 doi: 10.1109/TBC.2007.908329.

*Primary Examiner* — Nguyen Vo (74) *Attorney, Agent, or Firm* — Maschoff Brennan (57) ABSTRACT

A method of configuring a signal booster may include receiving an indication that a first interface port of a first amplifier is configured such that external signals are not introduced to the first amplifier and measuring thermal noise output by the first amplifier at a second amplifier communicatively coupled to a second interface port of the first amplifier after receiving the indication. The method may further include determining signal loss between the first amplifier and the second amplifier based on the measured thermal noise and setting a gain of the second amplifier based on the signal loss.

20 Claims, 8 Drawing Sheets

CONFIGURING SIGNAL BOOSTERS

The embodiments discussed herein are related to configuring signal boosters.

BACKGROUND

In a wireless communication system, communication may occur as uplink communications and downlink communications. Uplink communications may refer to communications that originate at a wireless communication device (referred to hereinafter as "wireless device") and that are transmitted to an access point (e.g., base station, remote radio head, wireless router, etc.) associated with the wireless communication system. Downlink communications may refer to communications from the access point to the wireless device.

Sometimes a wireless device in a wireless communication system may be positioned such that it may not adequately receive uplink and/or downlink communications from an access point. In these situations, a user of the wireless device may employ a signal booster to boost the uplink and/or downlink communications.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of one or more embodiments, a method of configuring a signal booster may include receiving an indication that a first interface port of a first amplifier is configured such that external signals are not introduced to the first amplifier and measuring thermal noise output by the first amplifier at a second amplifier communicatively coupled to a second interface port of the first amplifier after receiving the indication. The method may further include determining signal loss between the first amplifier and the second amplifier based on the measured thermal noise and setting a gain of the second amplifier based on the signal loss.

According to an aspect of one or more embodiments, a signal boosting system may include a first amplifier. The first amplifier may include a first interface port and a second interface port. The second interface port may be configured to be communicatively coupled to a first interface port of a second amplifier. The first amplifier may also include a gain unit coupled between the first interface port of the first amplifier and the second interface port of the first amplifier and a detector configured to measure thermal noise at an output of the second interface port of the first amplifier. Additionally, the first amplifier may include a control unit configured to set a gain of the uplink gain unit based on the measured thermal noise when the measured thermal noise is measured after the control unit receives an indication that a second interface port of the second amplifier is configured such that external signals are not introduced to the second amplifier at the second interface port of the second amplifier.

The object and advantages of the embodiments will be realized and achieved at least by the elements, features, and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

According to some embodiments, a signal booster may include first and second amplifiers that may be coupled by a cable, such as a coaxial cable. Loss may occur between signals transmitted between the first and second amplifiers along the cable. The signal booster discussed herein may be configured to determine the loss between the first and second amplifiers and set a gain of one of the first and second amplifiers based on the determined loss. In particular, in some embodiments, the first amplifier may determine a loss between the first and second amplifiers by measuring a thermal noise output by the second amplifier. Based on the measured thermal noise, the first amplifier may determine the loss between the first and second amplifiers and set a gain of the first amplifier based on the determined loss.

Figure 1:
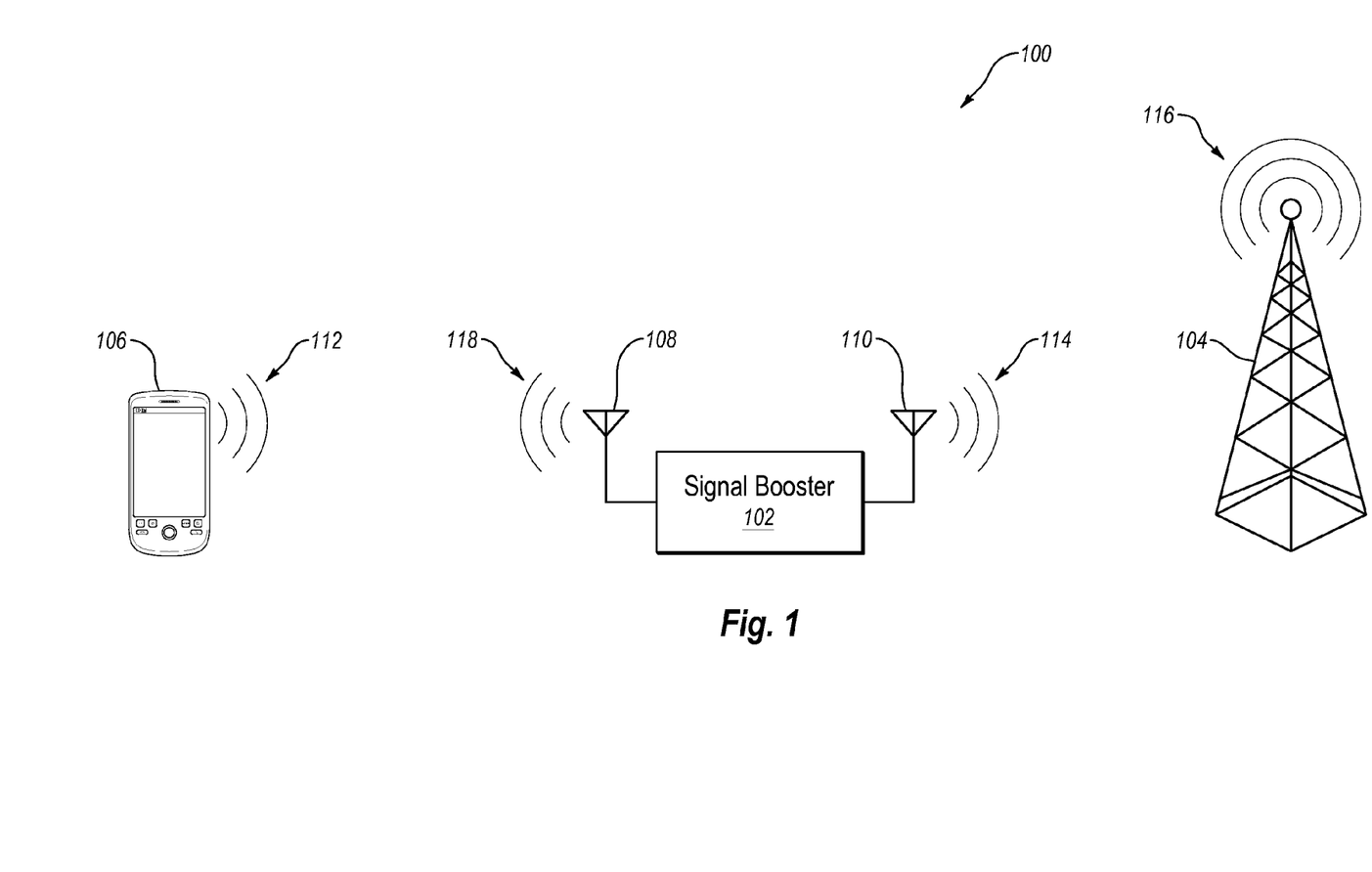
FIG. 1 illustrates an example wireless communication system.

FIG. 1 illustrates an example wireless communication system 100 (referred to hereinafter as "system 100"), arranged in accordance with at least some embodiments described herein. The system 100 may be configured to provide wireless communication services to a wireless device 106 via an access point 104. The system 100 may further include a bi-directional signal booster 102 (referred to hereinafter as "the signal booster 102"). The signal booster 102 may be any suitable system, device, or apparatus configured to receive wireless signals (e.g., radio frequency (RF) signals) communicated between the access point 104 and the wireless device 106. The signal booster 102 may be configured to amplify, repeat, filter, and/or otherwise process the received wireless signals and may be configured to re-transmit the processed wireless signals. Although not expressly illustrated in FIG. 1, the system 100 may include any number of access points 104 configured to provide wireless communication services to any number of wireless devices 106.

The wireless communication services provided by the system 100 may include voice services, data services, messaging services, and/or any suitable combination thereof. The system 100 may include a Frequency Division Duplexing (FDD) network, a Frequency Division Multiple Access (FDMA) network, an Orthogonal FDMA (OFDMA) network, a Code Division Multiple Access (CDMA) network, a Time Division Multiple Access (TDMA) network, a Direct Sequence Spread Spectrum (DSSS) network, a Frequency Hopping Spread Spectrum (FHSS) network, and/or some other wireless communication network. In some embodiments, the system 100 may be configured to operate as a second generation (2G)

wireless communication network, a third generation (3G) wireless communication network, a fourth generation (4G) wireless communication network, and/or a Wi-Fi network. In these or other embodiments, the system 100 may be configured to operate as a Long Term Evolution (LTE) wireless communication network.

The access point 104 may be any suitable wireless network communication point and may include, by way of example but not limitation, a base station, a remote radio head (RRH), a satellite, a wireless router, or any other suitable communication point. The wireless device 106 may be any device that may use the system 100 for obtaining wireless communication services and may include, by way of example and not limitation, a cellular phone, a smartphone, a personal data assistant (PDA), a laptop computer, a personal computer, a tablet computer, a wireless communication card, or any other similar device configured to communicate within the system 100.

As wireless signals propagate between the access point 104 and the wireless device 106, the wireless signals may be affected during the propagation such that, in some instances, the wireless signals may be substantially degraded. The signal degradation may result in the access point 104 or the wireless device 106 not receiving, detecting, or extracting information from the wireless signals. Therefore, the signal booster 102 may be configured to increase the power of and/or improve the signal quality of the wireless signals such that the communication of the wireless signals between the access point 104 and the wireless device 106 may be improved.

In some embodiments, the signal booster 102 may receive a wireless signal communicated between the access point 104 and the wireless device 106 and may convert the wireless signal into an electrical signal (e.g., via an antenna). The signal booster 102 may be configured to amplify the electrical signal and the amplified electrical signal may be converted into an amplified wireless signal (e.g., via an antenna) that may be transmitted. The signal booster 102 may amplify the electrical signal by applying a gain to the electrical signal. The gain may be a set gain or a variable gain, and may be less than, equal to, or greater than one. Therefore, in the present disclosure, the term "amplify" may refer to applying any gain to a wireless signal including gains that are less than one.

In some embodiments, the signal booster 102 may adjust the gain based on conditions associated with communicating the wireless signals (e.g., providing noise floor, oscillation, and/or overload protection). In these and other embodiments, the signal booster 102 may adjust the gain in real time. The signal booster 102 may also filter out noise associated with the received wireless signal such that the retransmitted wireless signal may be a cleaner signal than the received wireless signal. Therefore, the signal booster 102 may improve the communication of wireless signals between the access point 104 and the wireless device 106.

For example, the wireless device 106 may communicate a wireless uplink signal 112 intended for reception by the access point 104 and a first antenna 108 may be configured to receive the wireless uplink signal 112. The first antenna 108 may be configured to convert the received wireless uplink signal 112 into an electrical uplink signal. Additionally, the first antenna 108 may be communicatively coupled to a first interface port (not expressly depicted in FIG. 1) of the signal booster 102 such that the signal booster 102 may receive the electrical uplink signal from the first antenna 108 at the first interface port. An interface port may be any suitable port configured to interface the signal booster 102 with another device (e.g., an antenna, a modem, another signal booster, etc.) from which the signal booster 102 may receive a signal and/or to which the signal booster 102 may communicate a signal.

In some embodiments, the signal booster 102 may be configured to apply a gain to the electrical uplink signal to amplify the electrical uplink signal. In the illustrated embodiment, the signal booster 102 may direct the amplified electrical uplink signal toward a second interface port (not expressly depicted in FIG. 1) of the signal booster 102 that may be communicatively coupled to a second antenna 110. The second antenna 110 may be configured to receive the amplified electrical uplink signal from the second interface port and may convert the amplified electrical uplink signal into an amplified wireless uplink signal 114 that may also be transmitted by the second antenna 110. The amplified wireless uplink signal 114 may then be received by the access point 104.

In some embodiments, the signal booster 102 may also be configured to filter the electrical uplink signal to remove at least some noise associated with the received wireless uplink signal 112. Consequently, the amplified wireless uplink signal 114 may have a better signal-to-noise ratio (SNR) than the wireless uplink signal 112 that may be received by the first antenna 108. Accordingly, the signal booster 102 may be configured to improve the communication of uplink signals between the access point 104 and the wireless device 106. The use of the term "uplink signal," without specifying wireless or electrical uplink signals, may refer to wireless uplink signals or electrical uplink signals.

As another example, the access point 104 may communicate a wireless downlink signal 116 intended for the wireless device 106 and the second antenna 110 may be configured to receive the wireless downlink signal 116. The second antenna 110 may convert the received wireless downlink signal 116 into an electrical downlink signal such that the electrical downlink signal may be received at the second interface port of the signal booster 102. In some embodiments, the signal booster 102 may be configured to apply a gain to the electrical downlink signal to amplify the electrical downlink signal. The signal booster 102 may also be configured to direct the amplified electrical downlink signal toward the first interface port of the signal booster 102 such that the first antenna 108 may receive the amplified electrical downlink signal. The first antenna 108 may be configured to convert the amplified electrical downlink signal into an amplified wireless downlink signal 118 that may also be transmitted by the first antenna 108. The amplified wireless downlink signal 118 may then be received by the wireless device 106.

In some embodiments, the signal booster 102 may also be configured to filter the electrical downlink signal to remove at least some noise associated with the received wireless downlink signal 116. Therefore, the amplified wireless downlink signal 118 may have a better SNR than the wireless downlink signal 116 received by the second antenna 110. Accordingly, the signal booster 102 may also be configured to improve the communication of downlink signals between the access point 104 and the wireless device 106. The use of the term "downlink signal," without specifying wireless or electrical downlink signals, may refer to wireless downlink signals or electrical downlink signals.

Modifications may be made to the system 100 without departing from the scope of the present disclosure. For example, in some embodiments, the distance between the signal booster 102 and the wireless device 106 may be relatively close as compared to the distance between the signal booster 102 and the access point 104. Further, the system 100 may include any number of signal boosters 102, access points 104, and/or wireless devices 106. Additionally, in some embodiments, the signal booster 102 may be integrated with the wireless device 106, and in other embodiments, the signal booster 102 may be separate from the wireless device 106. Also, in some embodiments, the signal booster 102 may be included in a cradle configured to hold the wireless device 106. Additionally, in some embodiments, the signal booster 102 may be configured to communicate with the wireless device 106 via wired communications (e.g., using electrical signals communicated over a wire) instead of wireless communications (e.g., via wireless signals).

Additionally, although the signal booster 102 is illustrated and described with respect to performing operations with respect to wireless communications such as receiving and transmitting wireless signals via the first antenna 108 and the second antenna 110, the scope of the present disclosure is not limited to such applications. For example, in some embodiments, the signal booster 102 (or other signal boosters described herein) may be configured to perform similar operations with respect to communications that are not necessarily wireless, such as processing signals that may be received and/or transmitted via one or more modems or other signal boosters communicatively coupled to the interface ports of the signal booster 102 via a wired connection.

Figure 2A:
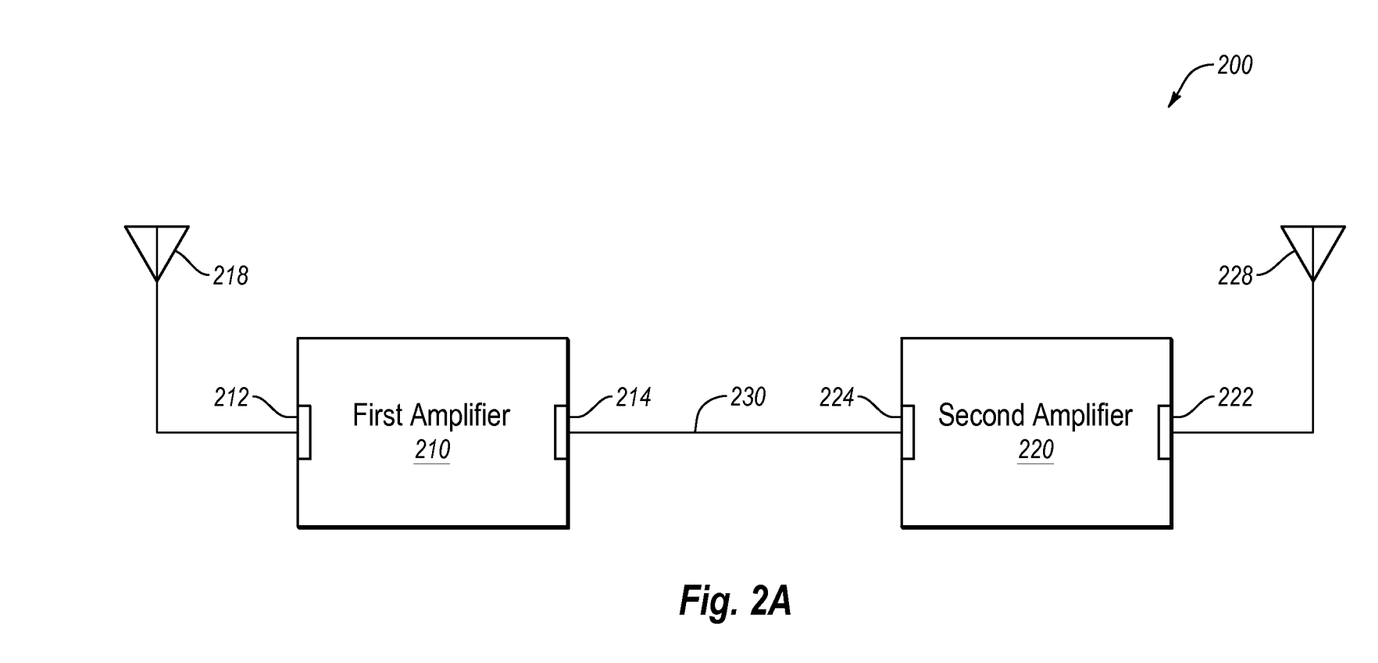
FIG. 2A is an embodiment of an example signal booster.

FIG. 2A illustrates an embodiment of an example signal booster 200, arranged in accordance with at least some embodiments described herein. In some embodiments, the signal booster 200 may be implemented as the signal booster 102 of FIG. 1.

The signal booster 200 may include a first amplifier 210 and a second amplifier 220. The first amplifier 210 may include a first interface port 212 and a second interface port 214. The second amplifier 220 may include a first interface port 222 and a second interface port 224. The first interface port 212 of the first amplifier 210 may be coupled to a first antenna 218 and the second interface port 214 may be coupled to the second interface port 224 of the second amplifier 220 by a cable 230. The first interface port 222 of the second amplifier 220 may be coupled to a second antenna 228. In some embodiments, the cable 230 may be a type of coaxial cable or some other type of cable that is lossy.

In the illustrated embodiments, the second antenna 228 may be configured to receive downlink signals from and transmit uplink signals to an access point. The first antenna 218 may be configured to receive uplink signals from and transmit downlink signals to a wireless device. In this configuration, the second amplifier 220 may be configured to apply a general amplification to the uplink and downlink signals based on configurations of the wireless communication network in which the signal booster 200 is operating. For example, the second amplifier 220 may operate to increase or decrease a gain applied to the uplink and downlink signals based on noise levels at the access point, government regulations, and wireless communication operator regulations, among others. In short, the second amplifier 220 may apply any known algorithm or scheme to amplify downlink and uplink signals to enhance or otherwise make communications between a wireless device and an access point function within the constraints of the wireless communications network in which the signal booster 200 is operating. In some embodiments, the second amplifier 220 may be considered a main amplifier.

The first amplifier 210 may be configured to compensate for loss between the second amplifier 220 and the first antenna 218. In some circumstances, the first antenna 218 may be separated from the second amplifier 220 at a distance such that a loss occurs between the first antenna 218 and the second amplifier 220.

Figure 2B:
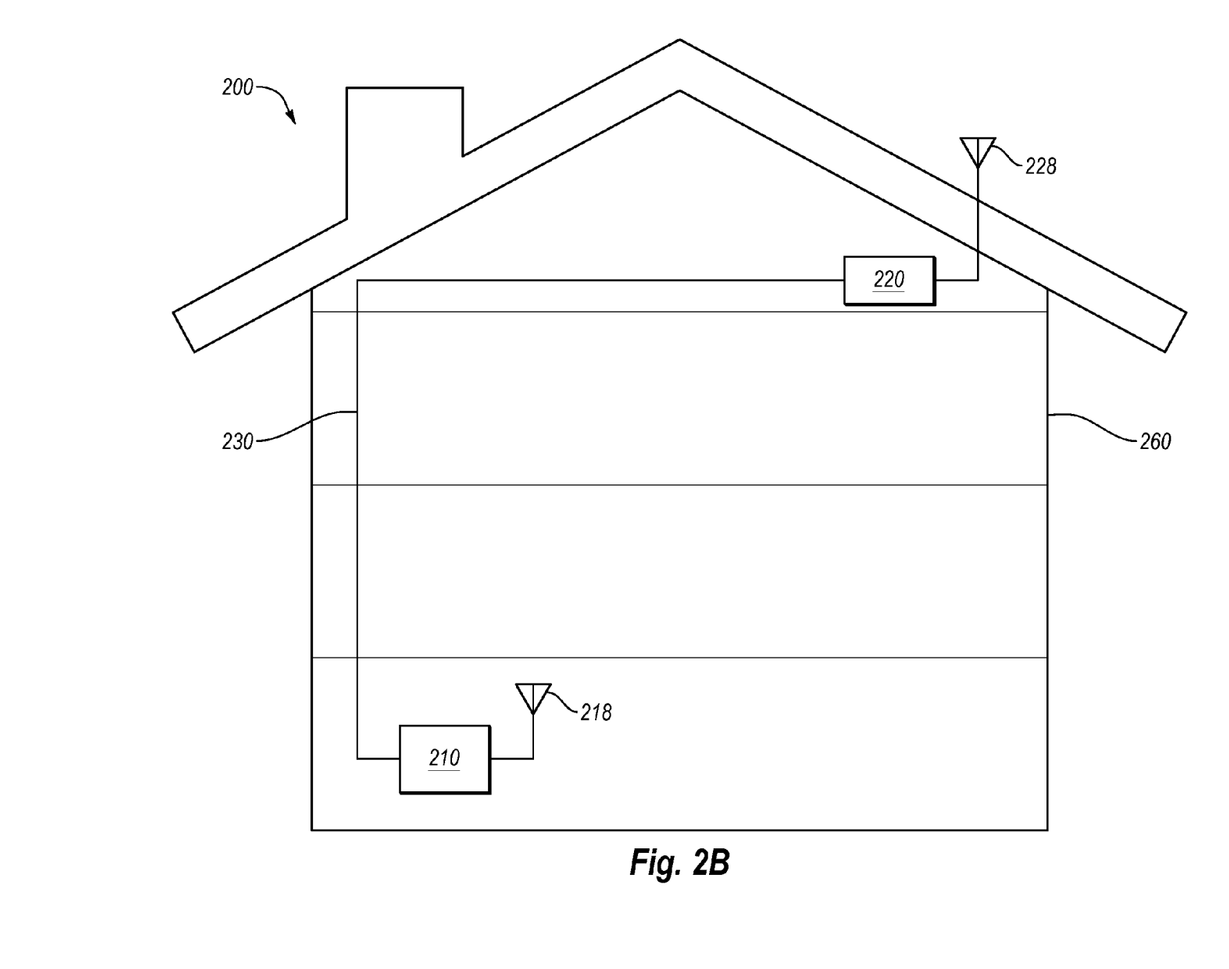
FIG. 2B is an embodiment of another example signal booster.

For example, FIG. 2B illustrates an embodiment of an example implementation of the signal booster 200 where the first antenna 218 is separated from the second amplifier 220. FIG. 2B illustrates a building 260, where the second antenna 228 is located on the roof of the building 260 in a manner to allow the second antenna 228 to receive downlink signals from and transmit uplink signals to an access point of a wireless communication system. The second amplifier 220 may be positioned relatively close to the second antenna 228. For example, the second amplifier 220 may be positioned within 2 meters (m), 4 m, 6 m, 10 m, or some other distance. The first antenna 218 may be positioned farther from the second amplifier 220 than a distance between the second amplifier 220 and the second antenna 228. For example, FIG. 2B illustrates the first antenna 218 positioned on a first level of the building 260. Due to the distance between the second amplifier 220 and the first antenna 218, losses may occur to signals transmitted between the second amplifier 220 and the first antenna 218. The distance between the second amplifier 220 and the first antenna may be 8 m, 10 m, 20 m, 40 m, 50 m, 150 m, or some other distance. The first amplifier 210 may be positioned such that it may help to compensate for the loss that occurs to signals transmitted between the second amplifier 220 and the first antenna 218.

Referring again to FIG. 2A, in some embodiments, the first amplifier 210 may be configured to determine or estimate the loss between the first antenna 218 and the second amplifier 220 by determining a loss between the first amplifier 210 and the second amplifier 220 (e.g., the loss within the cable 230). Based on the determined or estimated loss, the first amplifier 210 may set an internal gain to compensate for the loss. For example, when the first amplifier 210 determines the loss between the first and second amplifiers 210 and 220 to be 10 dB, the first amplifier 210 may set an internal gain to be 10 dB to compensate for the loss. Alternately or additionally, the second amplifier 220 may determine the loss or estimated loss and send the information to the first amplifier 210. The first amplifier 210 may then set an internal gain based on the information from the second amplifier 220.

The first amplifier 210 may be configured to determine the loss between the first amplifier 210 and the second amplifier 220 by measuring within the first amplifier 210 a thermal noise output by the second amplifier 220. Based on the measured thermal noise, the first amplifier 210 may set an internal gain of the first amplifier 210. For example, in some embodiments, the first amplifier 210 may set an internal gain of the first amplifier 210 based on a difference between the measured thermal noise and a selected thermal noise level. In these and other embodiments, the first amplifier 210 may set the internal gain of the first amplifier 210 to be equal to or approximately equal to a difference between the selected thermal noise level and the measured thermal noise.

In some embodiments, the selected thermal noise level may be determined based on a determined thermal noise output of the second amplifier 220. For example, the second amplifier 220 may measure the thermal noise output of the second amplifier 220 and send the measurement to the first amplifier 210. In these and other embodiments, the measurement of the thermal noise output performed by the second amplifier 220 may be the selected thermal noise level. Alternately or additionally, the first amplifier 210 may have an indication stored therein of the thermal noise output of the second amplifier 220. Alternately or additionally, the selected thermal noise level may be based on a maximum thermal noise level permitted by a governmental agency (e.g., the Federal Communications Commission (FCC) of the United States), a wireless communication network in which the signal booster 200 is operating, a standards board, or some other entity. In these and other embodiments, the maximum thermal noise level may be based on the frequencies of the signals configured to be amplified by the signal booster 200. In some embodiments, the maximum thermal noise level may be calculated by the following equation:

$$N\max = -102.5 \frac{\text{dBm}}{\text{MHz}} + 20 * \log(f)$$

where "Nmax" is the maximum thermal noise and "f" is the mid band uplink frequency configured to be amplified by the signal booster 200. In some embodiments, the maximum thermal noise may be used as the selected thermal noise level.

In some embodiments, the first amplifier 210 may be configured to measure the thermal noise output by the second amplifier 220 when the first interface port 222 of the second amplifier 220 is configured such that limited or no external signals are introduced into the second amplifier 220. For example, the first interface port 222 of the second amplifier 220 may be configured such that limited or no external signals are introduced into the second amplifier 220 by capping or terminating the first interface port 222. By not allowing the first interface port 222 to introduce external signals into the second amplifier 220, the first amplifier 210 may measure the thermal noise output by the second amplifier 220 more accurately.

For example, assume that the cable between the first and second amplifiers 210 and 220 introduces 20 dB of loss and that the selected thermal noise level is −150 dB. With no external signal being amplified by the second amplifier 220 and transmitted to the first amplifier 210, the first amplifier 210 may measure the thermal noise output by the second amplifier 220 at the first amplifier 210 to be −170 dB. Based on this calculation, the first amplifier 210 may set an internal gain to 20 dB.

In contrast, if an external signal is introduced into the second amplifier 220, the external signal may be amplified by the second amplifier 220 such that the first amplifier 210 may not adequately or fully compensate for a loss between the first amplifier 210 and the second amplifier 220. For example, if an external signal is introduced into the second amplifier 220, the thermal noise may appear to be higher than −150 dB, such as −135 dB as output by the second amplifier 220. Therefore, in this example, the first amplifier 210 may measure the thermal noise output by the second amplifier 220 to be −155 dB. Based on this calculation, the first amplifier 210 may set an internal gain of 5 dB. As a result, the first amplifier 210 may not adequately or fully compensate for a loss between the first amplifier 210 and the second amplifier 220.

In some embodiments, the first amplifier 210 may determine that the first interface port 222 of the second amplifier 220 is configured such that limited or no external signals are introduced into the second amplifier 220 when it receives an indication of such. In some embodiments, the first amplifier 210 may receive the indication from the second amplifier 220. Alternately or additionally, the first amplifier 210 may receive the indication from a user of signal booster 200. For example, a user may press a button on the first amplifier 210 to indicate to the first amplifier 210 that the first interface port 222 of the second amplifier 220 is configured such that limited or no external signals are introduced into the second amplifier 220.

In some embodiments, the first amplifier 210 may be configured to set an internal gain based on the measured thermal noise and a selected thermal noise level after determining that the measured thermal noise is within selected operating parameters. For example, in some embodiments, the first amplifier 210 may be configured to compare the measured thermal noise to a first selected thermal noise level. When the measured thermal noise is above the first selected thermal noise level, the first amplifier 210 may set an internal gain to zero or approximately zero. In some embodiments, the first selected thermal noise level may be a maximum thermal noise level of the signal booster 200 as discussed above. In these and other embodiments, the first selected thermal noise level may be equal to the selected thermal noise level.

In some embodiments, the first amplifier 210 may also be configured to compare the measured thermal noise to a second selected thermal noise level. When the measured thermal noise is below the second selected thermal noise level, the first amplifier 210 may set an internal gain to zero or approximately zero. In some embodiments, the second selected thermal noise level may be approximately equal to or equal to the maximum thermal noise level of signal booster 200, as discussed above, minus a maximum gain of the first amplifier 210. For example, assume the maximum thermal noise level of the signal booster 200 is −145 dB and the maximum gain of the first amplifier 210 is 20 dB. The second selected thermal noise level may be −165 dB. When the measured thermal noise level is less than −165 dB, the first amplifier 210 may set its internal gain to zero or approximately zero. By comparing the measured thermal noise level to a second selected thermal noise level, the first amplifier 210 may prevent improper use of the first amplifier 210.

For example, the first amplifier 210 may be configured to compensate for loss between the first and second amplifiers 210 and 220. A user may desire to use the first amplifier 210 to boost signals beyond limits set for the signal booster 200 instead of compensating for loss between the first and second amplifiers 210 and 220. For example, a user may place the first amplifier 210 in close proximity, such as 8 m, from the second amplifier 220. The user may configure the first amplifier 210 to measure the thermal noise when the second amplifier 220 is not operating. As a result, the thermal noise output by the second amplifier 220 would be close to −174 dB. The loss between the first and second amplifiers 210 and 220 may be 3 dB, but the first amplifier 210 may determine the loss to be greater and set its internal gain accordingly (e.g., to its maximum gain, e.g., 20 dB), even though the loss between the first and second amplifiers 210 and 220 is 3 dB. The first amplifier 210 comparing the measured thermal noise to the second selected thermal noise level may help to prevent such misuses of the signal booster 200.

In some embodiments, the first amplifier 210 may compare the measured thermal noise to both the first and second selected thermal noise levels before determining its internal gain. In these and other embodiments, after determining that the measured thermal noise is less than the first measured thermal noise level and greater than the second measured thermal noise level, the first amplifier 210 may set the internal gain of the first amplifier 210 to be equal to or approximately equal to a difference between the selected thermal noise level and the measured thermal noise. Other modifications, additions, or omissions may be made to the signal booster 200 without departing from the scope of the present disclosure.

The signal booster 200 as described herein may thus fully or partially compensate for losses between the second amplifier 220 and the first antenna 218 by using the first amplifier 210. Furthermore, the operation of the signal booster 200 as described herein may compensate for the losses without or with reduced occurrence of the signal booster 200 transmitting more signal noise than if the first antenna 218 was proximate the second amplifier 220 such that losses therebetween may be minimal. As a result, the signal booster 200 may comply with various governmental or other entity regulations that restrict signal noise of signal boosters and that restrict a signal booster that may be configured by a user to increase the thermal noise of signal boosters outside acceptable operating parameters.

Figure 3:
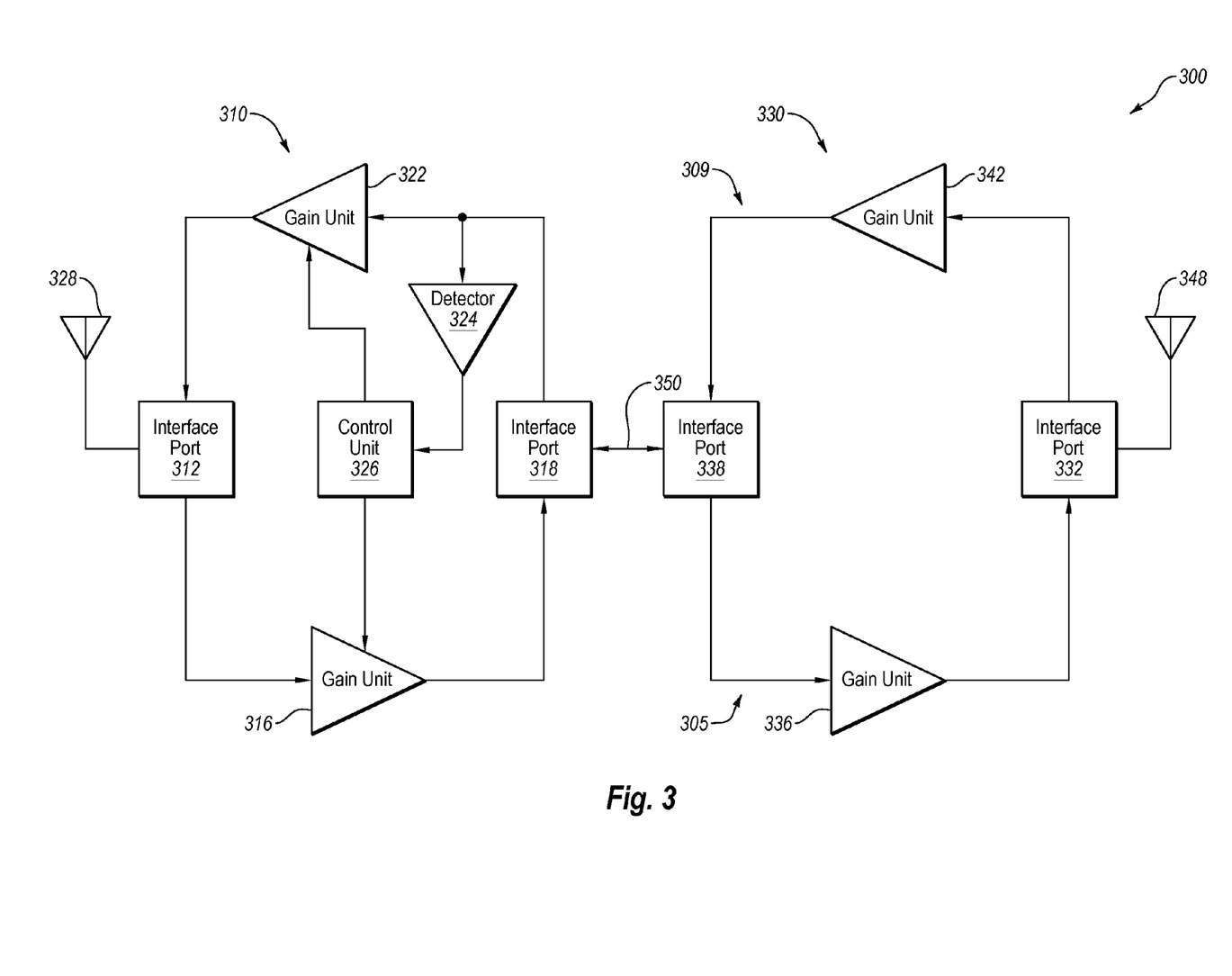
FIG. 3 is an embodiment of another example signal booster.

FIG. 3 illustrates an embodiment of an example signal booster 300, arranged in accordance with at least some embodiments described herein. The signal booster 300 may be configured to operate in an analogous manner as the signal booster 200 of FIG. 2A.

The signal booster 300 may include a first amplifier 310 and a second amplifier 330 that are communicatively coupled by a cable 350. The first amplifier 310 may also be communicatively coupled to a first antenna 328 and the second amplifier 330 may be communicatively coupled to a second antenna 348. The signal booster 300 may also include an uplink path 305 and a downlink path 309, each communicatively coupled between the first and second antennas 328 and 348.

The first amplifier 310 may include a first interface port 312 and a second interface port 318, with a first downlink gain unit 322 and a first uplink gain unit 316 coupled between the first interface port 312 and the second interface port 318. In some embodiments, the first interface port 312 and the second interface port 318 may be duplexers or some components that operate like duplexers, such as circulators, etc. Each of the first downlink gain unit 322 and the first uplink gain unit 316 may include one or more amplifiers or attenuators and may be configured to apply a gain to signals that is greater than or equal to zero. In some embodiments, the first downlink gain unit 322 and the first uplink gain unit 316 may each include an amplifier chain.

The first antenna 328 may be coupled to the first interface port 312 and the second amplifier 330 may be coupled to the second interface port 318. The first amplifier 310 may also include a detector 324 positioned between the second interface port 318 and the first downlink gain unit 322 and a control unit 326 coupled to the detector 324 and the first downlink and uplink gain units 322 and 316.

The second amplifier 330 may include a first interface port 332 and a second interface port 338, with a second downlink gain unit 342 and a second uplink gain unit 336 coupled between the first interface port 332 and the second interface port 338. In some embodiments, the first interface port 332 and the second interface port 338 may be duplexers or some components that operate like duplexers, such as circulators, etc. Each of the second downlink gain unit 342 and the second uplink gain unit 336 may include one or more amplifiers or attenuators and may be configured to apply a gain to signals that is greater than or equal to zero. In some embodiments, the second downlink gain unit 342 and the second uplink gain unit 336 may each include an amplifier chain. The second antenna 348 may be coupled to the first interface port 332 and the second interface port 318 of the first amplifier 310 may be coupled to the second interface port 338.

The uplink path 305 may be configured to amplify uplink signals received at the first antenna 328 that may be transmitted by a wireless device (e.g., the wireless device 106 of FIG. 1) and communicate the amplified uplink signals to the second antenna 348 for transmission by the second antenna 348 such that an access point of a wireless communication system (e.g., the access point 104 of FIG. 1) may receive the amplified uplink signals. The uplink path 305 may include the first and second interface ports 312 and 318 of the first amplifier 310, the first and second interface ports 332 and 338 of the second amplifier 330, and the first and second uplink gain units 316 and 336.

The downlink path 309 may be similarly configured to amplify downlink signals received at the second antenna 348 that may be transmitted by the access point, and communicate the amplified downlink signals to the first antenna 328 for transmission by the first antenna 328 such that the wireless device may receive the amplified downlink signals. The downlink path 309 may include the first and second interface ports 312 and 318 of the first amplifier 310, the first and second interface ports 332 and 338 of the second amplifier 330, and the first and second downlink gain units 322 and 342.

The detector 324 may be configured to measure thermal noise at an output of the second interface port 318 of the first amplifier 310. The thermal noise may be output by the second amplifier 330. The detector 324 may pass the measured thermal noise to the control unit 326. In some embodiments, the detector 324 may continuously or periodically send measured thermal noise to the control unit 326. Alternately or additionally, the detector 324 may be enabled and after being enabled, the detector 324 may send one or more thermal noise measurements to the control unit 326.

The control unit 326 may be configured to set a gain of the first uplink gain unit 316 and/or a gain of the first downlink gain unit 322 based on the measured thermal noise received from the detector 324. The control unit 326 may be further configured to receive an indication that the first interface port 332 of the second amplifier 330 is configured such that external signals are not introduced to the second amplifier 330. In these and other embodiments, the control unit 326 may be configured to set the gain of the first uplink gain unit 316 and/or the gain of the first downlink gain unit 322 based on the measured thermal noise received from the detector 324 when the measured thermal noise is measured after the control unit 326 receives the indication. In some embodiments, the control unit 326 may be configured to receive the indication from the second amplifier 330, from a user of the signal booster 300, or from some other source.

In some embodiments, the control unit 326 may be configured to receive the indication and may be configured to enable the detector 324 after or in response to receiving the indication. In these and other embodiments, the enabled detector 324 may then send the measured thermal noise to the control unit 326. As a result, the measured signal noise may be the result of a measurement of the signal noise when the first interface port 332 of the second amplifier 330 is configured such that external signals are not introduced to the second amplifier 330. In some embodiments, the first interface port 332 of the second amplifier 330 may be configured such that external signals are not introduced to the second amplifier 330 by capping or terminating the first interface port 332. In these and other embodiments, when the first interface port 332 is capped or terminated, the second amplifier 330 is not electrically coupled to the second antenna 348.

In some embodiments, the control unit 326 may be configured to determine signal loss between the first amplifier 310 and the second amplifier 330 based on the measured thermal noise and to set the gain of the first uplink gain unit 316 and/or the gain of the first downlink gain unit 322 based on the signal loss. In these and other embodiments, the control unit 326 may determine the signal loss by determining a difference between the measured thermal noise and a selected thermal noise level. The selected thermal noise level may be selected in an analogous manner as discussed above with respect to FIG. 2A. For example, the selected thermal noise level may be a maximum noise level that is based on frequencies of downlink and uplink signals that the signal booster 300 is configured to amplify.

In some embodiments, the control unit 326 may also compare the measured thermal noise to either a first or second thermal noise level or both the first and second thermal noise levels. In these and other embodiments, when the measured thermal noise is above the first selected thermal noise level, the control unit 326 may set the gain of the first uplink gain unit 316 and/or the gain of the first downlink gain unit 322 to zero. Alternately or additionally, when the measured thermal noise is below the second selected thermal noise level, the control unit 326 may set the gain of the first uplink gain unit 316 and/or the gain of the first downlink gain unit 322 to zero.

Modifications, additions, or omissions may be made to the signal booster 300 without departing from the scope of the present disclosure. For example, in some embodiments, the second amplifier 330 may include a control unit. In these and other embodiments, the control unit may operate to adjust gains of the second uplink and downlink gain units 336 and 342 based on characteristics of the communications network in which the signal booster 300 is operating. Alternately or additionally, the signal booster 300 may not include one or more of the first and second antennas 328 and 348. Alternately or additionally, the second amplifier 330 may include a detector configured to provide an indication to the first amplifier 310 that the second amplifier 330 is configured such that external signals are not introduced to the second amplifier 330.

Figure 4:
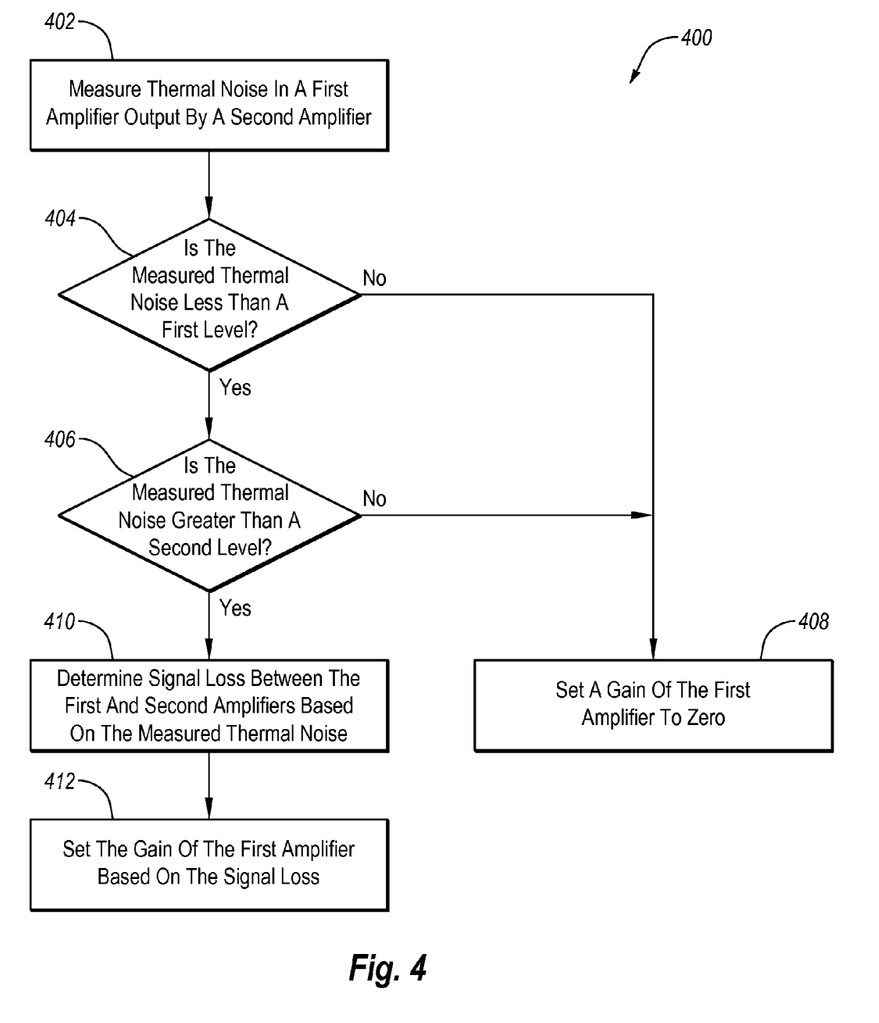
FIG. 4 is a flowchart of an example method of configuring a signal booster.

FIG. 4 is a flowchart of an example method 400 of configuring a signal booster, arranged in accordance with at least some embodiments described herein. The method 400 may be implemented, in some embodiments, by a signal booster, such as the signal booster 200, 250, 300, 500A, or 500B of FIGS. 2A, 2B, 3, 5A, and 5B, respectively. Although illustrated as discrete blocks, various blocks may be divided into additional blocks, combined into fewer blocks, or eliminated, depending on the desired implementation.

The method 400 may begin at block 402, where thermal noise may be measured. The thermal noise may be measured in a first amplifier and may be related to thermal noise output by a second amplifier that is coupled to the first amplifier. The first and second amplifiers may be configured to amplify uplink and/or downlink signals in a wireless communication network.

In block 404, the measured thermal noise may be compared to a first selected thermal noise level. In some embodiments, the first selected thermal noise level may be based on a maximum thermal noise level permitted by a governmental agency, a wireless communication network in which the first and second amplifiers are operating, a standards board, or some other entity. When the measured thermal noise level is greater than the first selected thermal noise level, the method 400 may proceed to block 408. When the measured thermal noise level is less than the first selected thermal noise level, the method 400 may proceed to block 406.

In block 406, the measured thermal noise may be compared to a second selected thermal noise level. In some embodiments, the second selected thermal noise level may be based on the first selected thermal noise level and a maximum gain of the first amplifier. When the measured thermal noise level is greater than the second selected thermal noise level, the method 400 may proceed to block 410. When the measured thermal noise level is less than the second selected thermal noise level, the method 400 may proceed to block 408.

In block 408, an internal gain of the first amplifier may be set to zero. In block 410, a signal loss between the first and second amplifiers may be determined based on the measured thermal noise. In some embodiments, the signal loss may be determined based on a difference between the measured thermal noise and the first selected thermal noise level. Alternately or additionally, the signal loss may be determined based on a difference between a selected thermal noise level and the measured thermal noise.

In block 412, the internal gain of the first amplifier may be set based on the determined signal loss. In particular, the internal gain of the first amplifier may be set to compensate for the signal loss between the first and second amplifiers.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

Figure 5A:
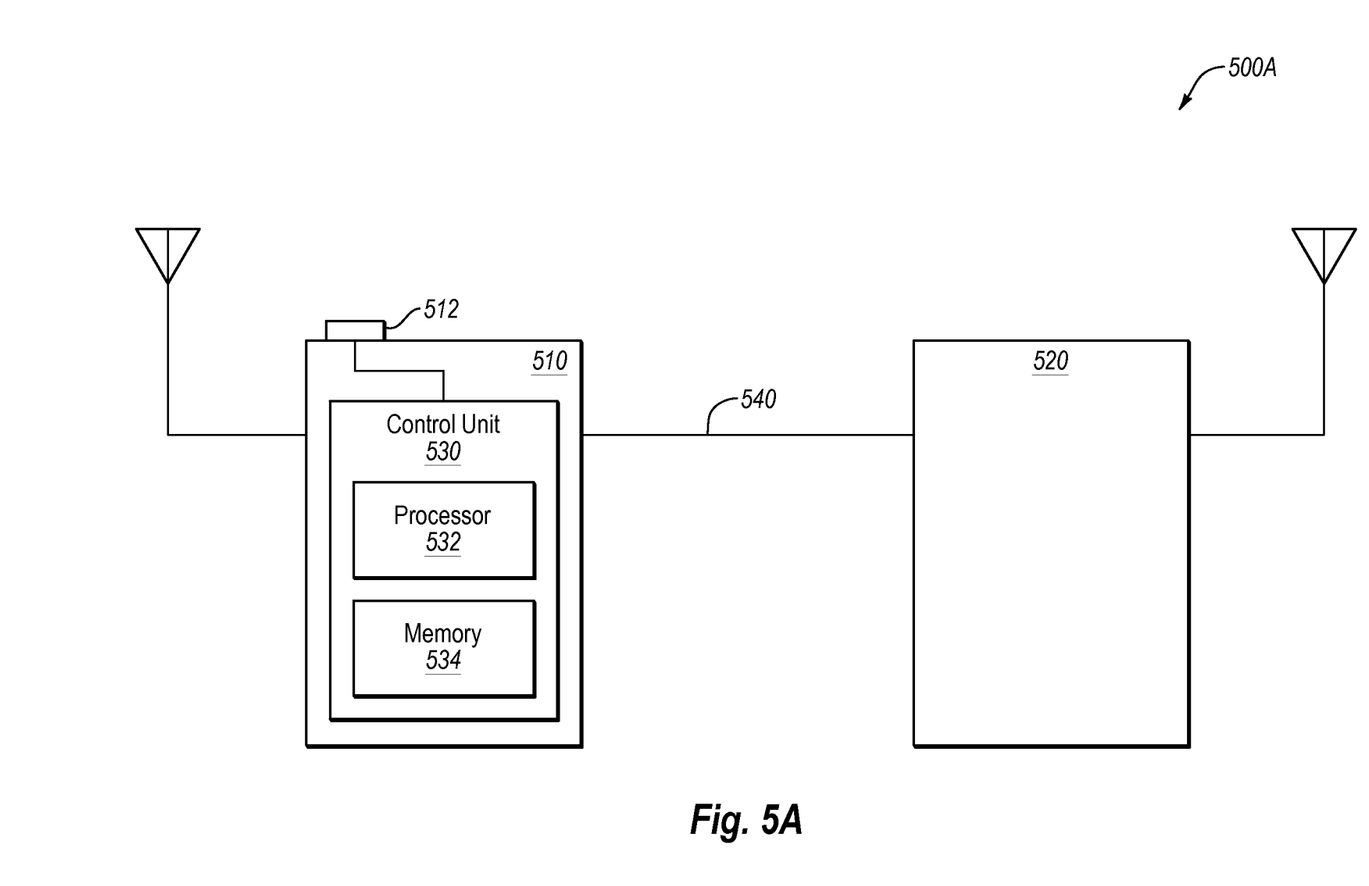
FIG. 5A is an embodiment of another example signal booster.

FIG. 5A is an embodiment of another example signal booster 500A, arranged in accordance with at least some embodiments described herein. The signal booster 500A may include a first amplifier 510 that is coupled to a second amplifier 520 by a cable 540. The first amplifier 510 may include a control unit 530. The first amplifier 510 may be configured to measure thermal noise output by the second amplifier 520. The measured thermal noise may be used by the control unit 530 to set a gain within the first amplifier 510.

In some embodiments, the control unit 530 may be configured to use the measured thermal noise to set the gain within the first amplifier 510 after the control unit 530 receives an indication that the second amplifier 520 is configured such that external signals are not introduced to the second amplifier 520. As illustrated in FIG. 5A, the first amplifier 510 may include an indicator 512 that may receive an input from a user of the first amplifier 510 that external signals are not being introduced to the second amplifier 520. Based on the input from the user, the indicator 512 may send the indication to the control unit 530.

In some embodiments, the indicator 512 may be a button that is pushed by the user to indicate that external signals are not being introduced to the second amplifier 520. Alternately or additionally, the indicator 512 may be a switch, a position of which is changed by a user to indicate that external signals are not being introduced to the second amplifier 520. Alternately or additionally, the indicator 512 may be any device that allows a user to indicate that external signals are not being introduced to the second amplifier 520 and to pass the indication to the control unit 530.

In some embodiments, the control unit 530 may be implemented by any suitable mechanism, such as a program, software, function, library, software as a service, analog, or digital circuitry, or any combination thereof. For example, the control unit 530 may include a processor 532 and memory 534. The processor 532 may include, for example, a microprocessor, microcontroller, digital signal processor (DSP), application-specific integrated circuit (ASIC), a Field-Programmable Gate Array (FPGA), or any other digital or analog circuitry configured to interpret and/or to execute program instructions and/or to process data. In some embodiments, the processor 532 may interpret and/or execute program instructions and/or process data stored in the memory 534. The instructions may include instructions for configuring the first amplifier 510 and in particular, the gain of the first amplifier 510.

The memory 534 may include any suitable computer-readable media configured to retain program instructions and/or data for a period of time. By way of example, and not limitation, such computer-readable media may include tangible and/or non-transitory computer-readable storage media including Random Access Memory (RAM), Read-Only Memory (ROM), Electrically Erasable Programmable Read-Only Memory (EEPROM), Compact Disc Read-Only Memory (CD-ROM) or other optical disk storage, magnetic disk storage or other magnetic storage devices, flash memory devices (e.g., solid state memory devices), or any other storage medium which may be used to carry or store desired program code in the form of computer-executable instructions or data structures and which may be accessed by a general purpose or special purpose computer. Combinations of the above may also be included within the scope of computer-readable media. Computer-executable instructions may include, for example, instructions and data that cause a general purpose computer, special purpose computer, or special purpose processing device to perform a certain function or group of functions. Modifications, additions, or omissions may be made to the signal booster 500A without departing from the scope of the present disclosure.

Figure 5B:
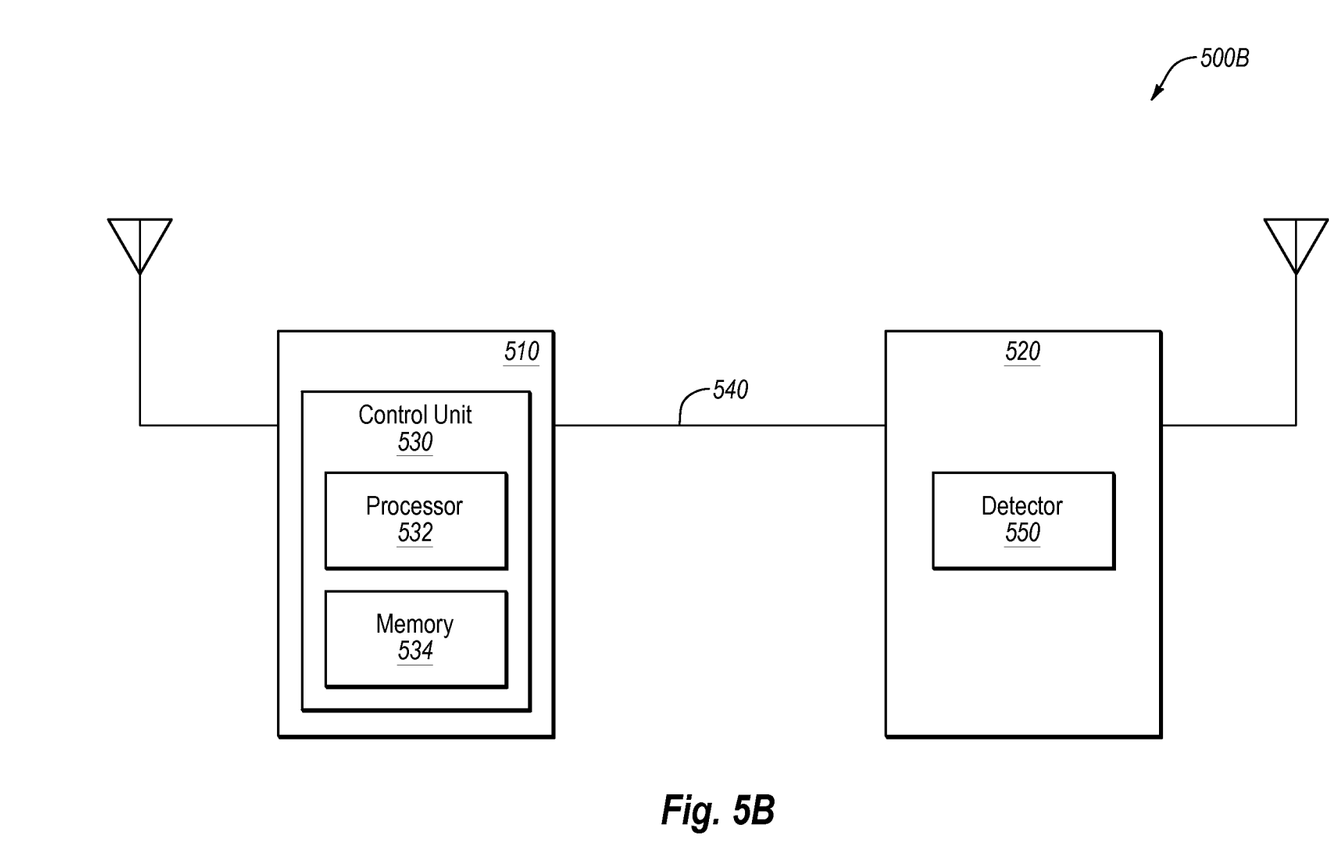
FIG. 5B is an embodiment of another example signal booster.

FIG. 5B is an embodiment of another example signal booster 500B, arranged in accordance with at least some embodiments described herein. The signal booster 500B may include the first amplifier 510 and the second amplifier 520, with the first amplifier 510 including the control unit 530, the processor 532, and the memory 534 as described with respect to FIG. 5A.

In the illustrated embodiment, the second amplifier 520 includes a detector 550. The detector 550 may be configured to detect when external signals are not being introduced to the second amplifier 520. The detector 550 may send an indication that external signals are not being introduced to the second amplifier 520 along the cable 540 to the control unit 530 of the first amplifier 510. Alternately or additionally, the detector 550 may send an indication that external signals are not being introduced to the second amplifier 520 to the first amplifier 510 using wireless communications or some other wired communication. Modifications, additions, or omissions may be made to the signal booster 500B without departing from the scope of the present disclosure.

Figure 6:
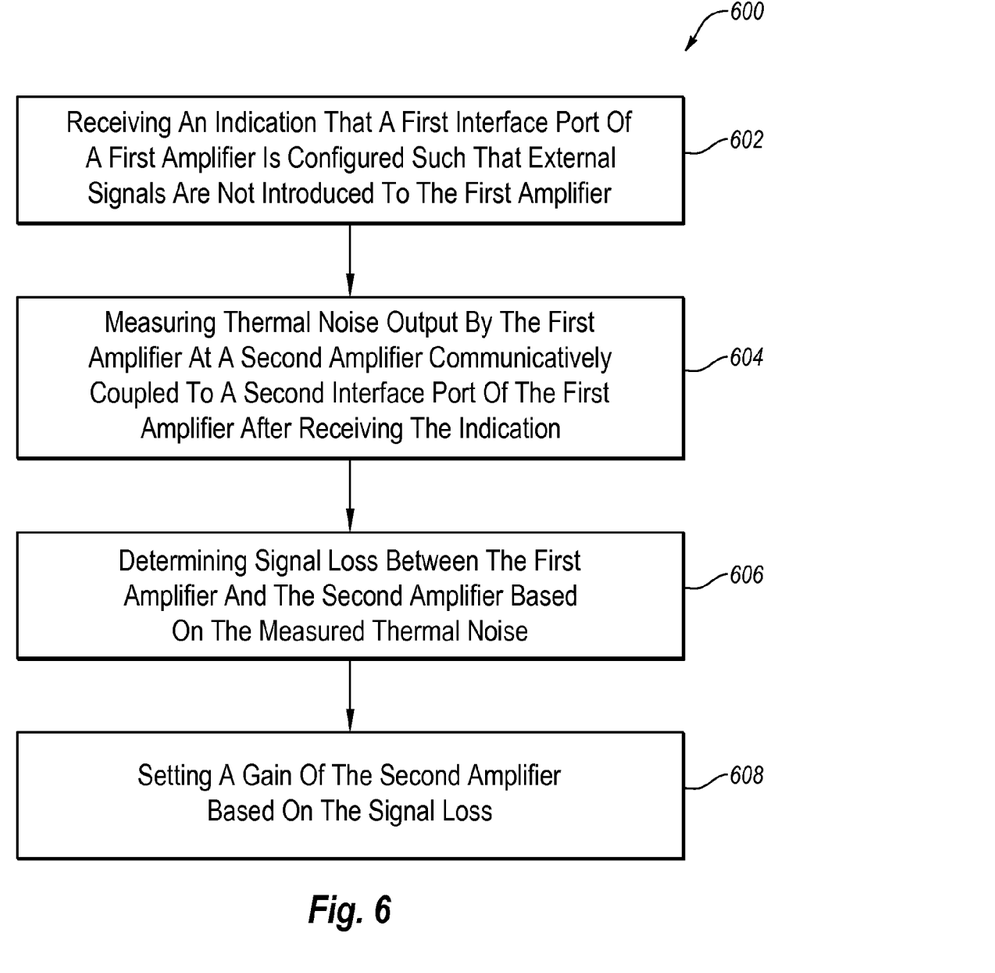
FIG. 6 is a flowchart of another example method of configuring a signal booster.

FIG. 6 is a flowchart of another example method 600 of configuring a signal booster, arranged in accordance with at least some embodiments described herein. The method 600 may be implemented, in some embodiments, by a signal booster, such as the signal booster 200, 250, 300, 500A, or 500B of FIGS. 2A, 2B, 3, 5A, and 5B, respectively. Although illustrated as discrete blocks, various blocks may be divided into additional blocks, combined into fewer blocks, or eliminated, depending on the desired implementation.

The method 600 may begin at block 602, where an indication may be received that a first interface port of a first amplifier is configured such that external signals are not introduced to the first amplifier. In some embodiments, the indication may be based on information provided by the first amplifier. In some embodiments, the indication may be provided by an indicator that receives input from a user of the second amplifier.

In block 604, thermal noise output by the first amplifier may be measured at a second amplifier communicatively coupled to a second interface port of the first amplifier after receiving the indication.

In block 606, a signal loss between the first amplifier and the second amplifier may be determined based on the measured thermal noise. In some embodiments, the signal loss between the first amplifier and the second amplifier may be determined based on the measured thermal noise and a maximum noise level that is based on frequencies of signals that the first and second amplifiers are configured to amplify.

In block 608, a gain of the second amplifier may be set based on the signal loss. In some embodiments, the gain of the second amplifier may be set to compensate for signal loss between the first and second amplifiers.

In some embodiments, the method 600 may further include comparing the measured thermal noise with one or more of a first thermal noise level and a second thermal noise level. In some embodiments, the gain of the second amplifier may be set to zero when the measured thermal noise is below the first thermal noise level. Alternately or additionally, the gain of the second amplifier may be set to zero when the measured thermal noise is above the second thermal noise level.

In some embodiments, the gain of the second amplifier may be set based on the signal loss when the measured thermal noise is above the first thermal noise level and below the second thermal noise level. In some embodiments, the second thermal noise level may be based on a government standard. In some embodiments, the first thermal noise level may be based on the second thermal noise standard and a maximum gain of the second amplifier.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present invention have been described in detail, it should be understood that the various changes, substitutions, and alterations could be made hereto without departing from the spirit and scope of the invention.

What is claimed is:

1. A method of configuring a signal booster, the method comprising:
   receiving an indication that a first interface port of a first amplifier is configured such that external signals are not introduced to the first amplifier;
   measuring thermal noise output by the first amplifier at a second amplifier communicatively coupled to a second interface port of the first amplifier after receiving the indication;
   determining signal loss between the first amplifier and the second amplifier based on the measured thermal noise; and
   setting a gain of the second amplifier based on the signal loss.

2. The method of claim 1, further comprising comparing the measured thermal noise with one or more of a first thermal noise level and a second thermal noise level.

3. The method of claim 2, wherein the gain of the second amplifier is set to zero when the measured thermal noise is below the first thermal noise level and the gain of the second amplifier is set to zero when the measured thermal noise is above the second thermal noise level.

4. The method of claim 2, wherein the gain of the second amplifier is set based on the signal loss when the measured thermal noise is above the first thermal noise level and below the second thermal noise level.

5. The method of claim 2, wherein the second thermal noise level is based on a government standard.

6. The method of claim 2, wherein the first thermal noise level is based on the second thermal noise level and a maximum gain of the second amplifier.

7. The method of claim 1, wherein the signal loss between the first amplifier and the second amplifier is determined based on the measured thermal noise and a maximum noise level that is based on frequencies of signals that the first and second amplifiers are configured to amplify.

8. The method of claim 1, wherein the indication is provided by an indicator that receives input from a user of the second amplifier.

9. The method of claim 1, wherein the indication is based on information provided by the first amplifier.

10. A signal boosting system comprising:
a first amplifier comprising:
  a first interface port;
  a second interface port configured to be communicatively coupled to a first interface port of a second amplifier;
  a gain unit coupled between the first interface port of the first amplifier and the second interface port of the first amplifier;
  a detector configured to measure thermal noise at an output of the second interface port of the first amplifier; and
  a control unit configured to set a gain of the gain unit based on the measured thermal noise when the measured thermal noise is measured after the control unit receives an indication that a second interface port of the second amplifier is configured such that external signals are not introduced to the second amplifier.

11. The signal boosting system of claim 10, wherein the gain unit is an uplink gain unit configured to amplify uplink signal provided to the first interface port, the first amplifier further comprising a downlink gain unit coupled between the first interface port of the first amplifier and the second interface port of the first amplifier, the downlink gain unit configured to amplify downlink signals provided to the second interface port.

12. The signal boosting system of claim 10, further comprising an indicator configured to provide the indication to the control unit.

13. The signal boosting system of claim 12, wherein the indicator is configured to provide the indication based on input from a user of the first amplifier.

14. The signal boosting system of claim 12, wherein the indicator is configured to provide the indication based on information provided by the second amplifier.

15. The signal boosting system of claim 10, wherein the control unit is configured to determine signal loss between the first amplifier and the second amplifier based on the measured thermal noise and to set the gain of the gain unit based on the signal loss.

16. The signal boosting system of claim 15, wherein the signal loss between the first amplifier and the second amplifier is determined by the control unit based on the measured thermal noise and a maximum noise level, the maximum noise level being based on frequencies of signals that the first and second amplifiers are configured to amplify.

17. The signal boosting system of claim 15, wherein the control unit is further configured to set the gain of the gain unit based on the signal loss when the measured thermal noise is above a first thermal noise level and below a second thermal noise level.

18. The signal boosting system of claim 17, wherein the control unit is configured to set the gain of the gain unit to zero when the measured thermal noise is less than a first thermal noise level or greater than a second thermal noise level.

19. The signal boosting system of claim 10, further comprising:
the second amplifier; and
a cable configured to couple the second interface port of the first amplifier to the first interface port of the second amplifier.

20. An amplifier comprising:
a first interface port;
a second interface port configured to be communicatively coupled to a first interface port of a main amplifier;
an uplink gain unit coupled between the first interface port of the amplifier and the second interface port of the amplifier and configured to amplify uplink signals provided to the first interface port;
a downlink gain unit coupled between the first interface port of the amplifier and the second interface port of the amplifier, the downlink gain unit configured to amplify downlink signals provided to the second interface port;
a detector configured to measure thermal noise between the second interface port of the first amplifier and the downlink gain unit; and
a control unit configured:
  to determine signal loss between the amplifier and the main amplifier based on the measured thermal noise when the measured thermal noise is measured after the control unit receives an indication that a second interface port of the main amplifier is configured such that external signals are not introduced to the main amplifier; and
  to set a gain of the uplink gain unit based on the signal loss.

* * * * *